(12) United States Patent
Lee et al.

(10) Patent No.: US 6,875,666 B2
(45) Date of Patent: Apr. 5, 2005

(54) METHODS OF MANUFACTURING TRANSISTORS AND TRANSISTORS HAVING AN ANTI-PUNCHTHROUGH REGION

(75) Inventors: Chang-Sub Lee, Suwon-si (KR);
Jeong-Dong Choi, Anyang-si (KR);
Seong-Ho Kim, Yongin-si (KR);
Shin-Ae Lee, Suwon-si (KR);
Sung-Min Kim, Incheon-si (KR);
Dong-Gun Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/458,028

(22) Filed: Jun. 9, 2003

(65) Prior Publication Data

US 2004/0077148 A1 Apr. 22, 2004

(30) Foreign Application Priority Data

Oct. 18, 2002 (KR) ................................ 10-2002-0063818

(51) Int. Cl.[7] .......................................... H01L 21/336
(52) U.S. Cl. ..................................................... 438/302
(58) Field of Search ................................. 438/302, 301, 438/299, 197, 291, 76; 257/475, 344

(56) References Cited

U.S. PATENT DOCUMENTS

| 5,489,543 A | 2/1996 | Hong ........................... 437/41 |
|---|---|---|
| 5,926,712 A * | 7/1999 | Chen et al. ................... 438/291 |
| 5,943,556 A * | 8/1999 | Hatano et al. ................. 438/76 |
| 6,207,428 B1 | 3/2001 | Capuder ....................... 435/119 |
| 6,285,061 B1 | 9/2001 | Shell et al. ................... 257/344 |

FOREIGN PATENT DOCUMENTS

JP        11-214687       1/1998

* cited by examiner

*Primary Examiner*—Carl Whitehead, Jr.
*Assistant Examiner*—Monica D. Harrison
(74) *Attorney, Agent, or Firm*—Myers Bigel Sibley & Sajovec

(57) ABSTRACT

Transistors of a semiconductor device are fabricated by forming a plurality of gate electrodes on a semiconductor substrate. The gate electrodes are used as an ion implantation mask. A first impurity is ion implanted below the exposed surface of the semiconductor substrate to form first impurity regions. A second impurity is ion implanted in two directions by tilting the implantation to a predetermined angle to thereby form second impurity regions separated from the first impurity regions. The second impurity regions are formed below the channel region under the gate electrodes. The second impurity regions may overlap to provide a higher impurity concentration below a portion of the channel.

20 Claims, 18 Drawing Sheets

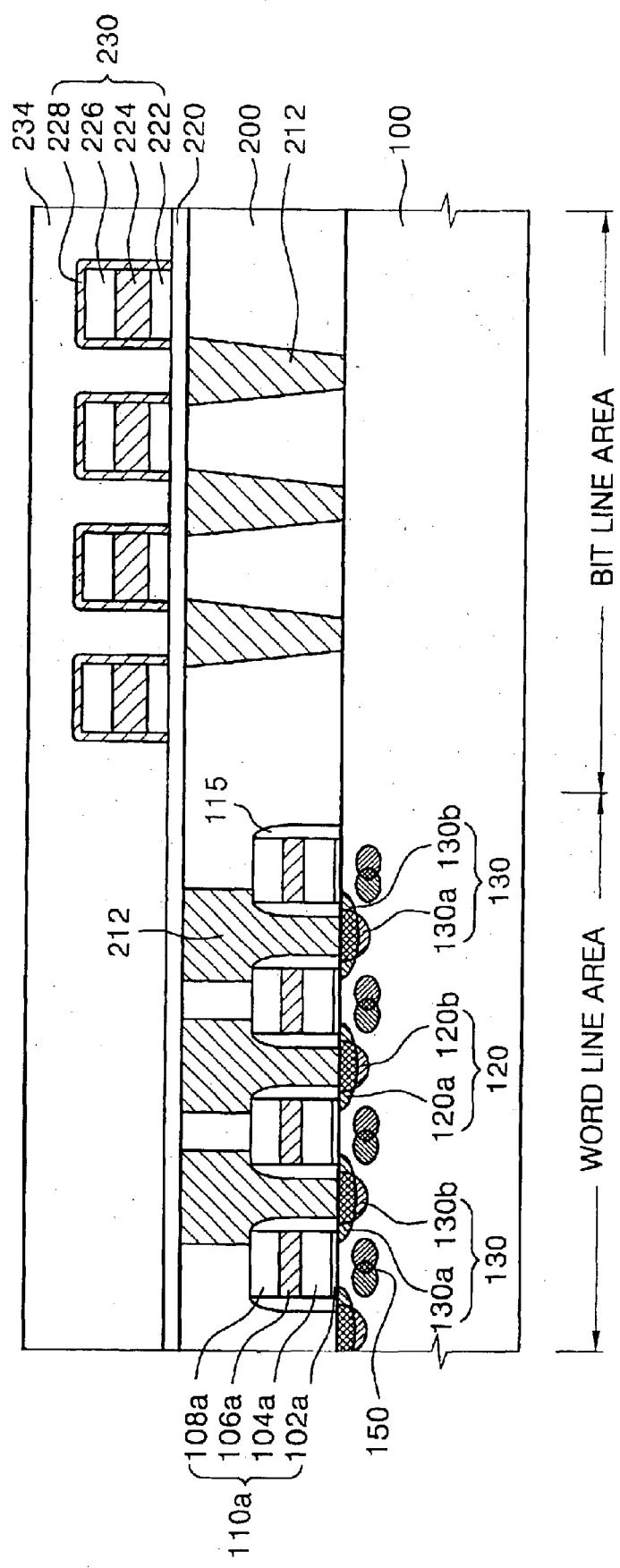

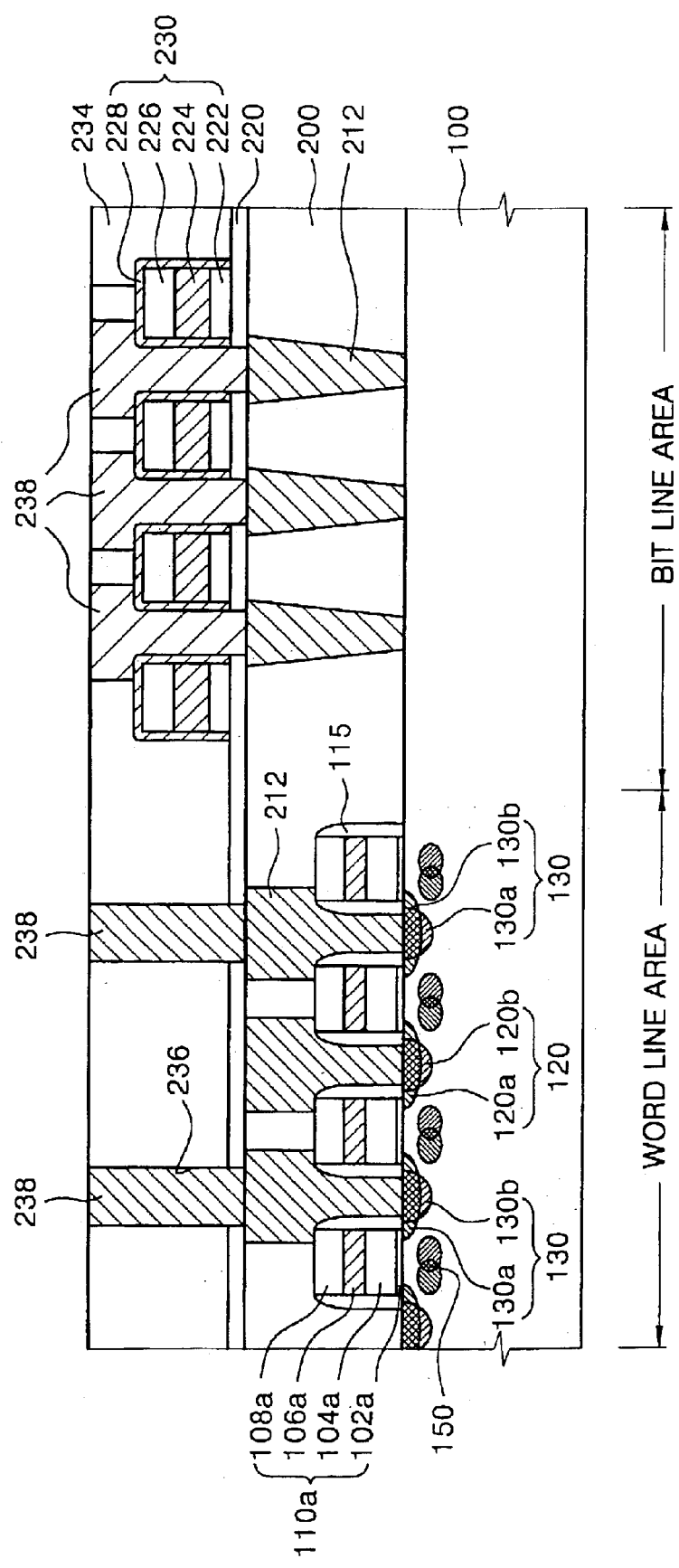

METHODS OF MANUFACTURING TRANSISTORS AND TRANSISTORS HAVING AN ANTI-PUNCHTHROUGH REGION

RELATED APPLICATIONS

The present application claims priority from Korean Patent Application Serial No. 2002-63818, filed Oct. 18, 2002, the disclosure of which is incorporated herein by reference as if set forth fully herein.

FIELD OF THE INVENTION

The present invention relates to methods of manufacturing semiconductor devices, and more particularly, to methods of manufacturing transistors and devices so manufactured.

BACKGROUND OF THE INVENTION

FIG. 1 is a cross-sectional view of a conventional MOS transistor. Referring to FIG. 1, the MOS transistor has a gate electrode 3 on a semiconductor substrate 1 with a gate oxide layer 2 interposed therebetween. Source/drain regions 4 and 5 are provided in the substrate 1 on opposite sides of the gate electrode 3. Carriers such electrons or holes are supplied to the source region 4 and removed from the drain region 5. The gate electrode 3 provides for forming a surface inversion layer, i.e., a channel, extending between the source region 4 and the drain region 5.

In scaling down MOS transistors to provide higher integration of semiconductor devices, the reduction in the length of the gate electrode may occur at a greater rate than reductions in the operating voltage of the device. With down scaling of the gate length, the influence of the source/drain upon the electric field or potential in the channel region of the MOS transistor may increase. This is, generally, called a "short channel effect" and may result in lowering of a threshold voltage of the transistor. This is because the channel region may be influenced by the depletion charge, the electric field and the potential distribution of the source/drain regions as well as the gate electrode.

In the MOS transistor of FIG. 1, the drain depletion layer 7 is widened in proportion to the increase in the drain voltage, so that the drain depletion layer 7 comes close to the source region 4. Thus, the drain depletion layer 7 and the source depletion layer 6 may connect to each other if the length of the gate electrode 7 is decreased. The electric field of the drain may eventually penetrate into the source region 4 and, thereby, reduce the potential energy barrier of the source junction. When this occurs, more majority carriers in the source region 4 have enough energy to overcome the barrier, and an increased current flows from the source region 4 to the drain region 5. This is often referred to as a "punchthrough" phenomenon. When punchthrough occurs, the drain current is not saturated but rapidly increased in the saturation region.

In conventional MOS transistor technology, a threshold voltage (Vt) adjusting implant is performed to provide a desired threshold voltage. For example, a p-type impurity such as boron (B) may be ion implanted in an NMOS transistor.

When the drain voltage is relatively low in a short-channel MOS transistor, the drain depletion layer does not extend to the source region, but the surface of the substrate is depleted to some degree by the gate electrode, thereby varying the height of the potential barrier near the source. This is commonly called "surface punchthrough." The Vt-adjusting implant increases the doping concentration of the interface between the substrate and the gate oxide layer, thereby suppressing the surface punchthrough as well as adjusting the threshold voltage.

Methods of forming an anti-punchthrough region below the gate electrode are disclosed in Japanese Patent Laid Open Publication No. 11-214687 and U.S. Pat. Nos. 6,207,428, 5,926,712, 6,285,061.

In dynamic random access memory (DRAM) devices in which a unit memory cell has one transistor and one capacitor cell, a data restoring operation, i.e., a refresh for recharging the data charge is necessary because the data charge of the capacitor decreases due to the leakage current with the lapse of time. Typically, the cell transistor is an NMOS transistor. Therefore, when the ion implantation is performed at a high dose, the junction leakage current increases due to the high electric field at the pn junction where the n-type source/drain regions makes contact with the p+ region (i.e., anti-punchthrough region), resulting in the deterioration of the charge and may result in a need for more frequent refresh.

Methods of locally forming anti-punchthrough regions directly below the gate electrode are disclosed in U.S. Pat. Nos. 5,489,543 and 6,285,061.

SUMMARY OF THE INVENTION

Embodiments of the present invention provide methods for forming transistors of a semiconductor device by forming a plurality of gate electrodes at regular intervals on a semiconductor substrate. A first impurity is ion implanted below an exposed surface of the semiconductor substrate using the gate electrodes as an ion implantation mask, to thereby form first impurity regions. A second impurity is ion implanted in two directions at predetermined tilt angles, using the gate electrodes as an ion implantation mask, to thereby form second impurity regions separated from the first impurity regions, each of the second impurity regions being formed below channel regions under respective ones of the gate electrodes.

In further embodiments of the present invention, the gate electrodes are formed at equal intervals between isolation regions of the semiconductor substrate. The gate electrodes may be formed by forming a gate oxide layer on the semiconductor substrate, forming a polysilicon layer on the gate oxide layer, forming a metal silicide layer on the polysilicon layer, forming a silicon nitride layer on the metal silicide layer and patterning the gate oxide layer, polysilicon layer, metal silicide layer and silicon nitride layer using an etching mask to provide the plurality of gate electrodes.

In certain embodiments of the present invention, the first impurity regions are source/drain regions. Furthermore, the first impurity may be a Group V element and the second impurity a Group III element. Alternatively, the first impurity may be a Group III element and the second impurity a Group V element.

In still further embodiments of the present invention, the second impurity regions are formed to overlap with each other below a center of the respective ones of the channel region. The ion implantation angle may be determined based on a height of the gate electrode and/or a space between the gate electrodes.

In yet other embodiments of the present invention, methods of forming transistors of a semiconductor device include forming a plurality of gate electrodes at regular intervals on a semiconductor substrate. A first concentration of a first impurity is ion implanted below an exposed surface of the semiconductor substrate using the gate electrodes as an ion implantation mask, to thereby form first source/drain regions. A second impurity is ion implanted in two directions at predetermined tilt angles, using the gate electrodes as an ion implantation mask, to thereby form second impurity regions separated from the first source/drain regions where the second impurity regions are formed below a channel region of respective ones of the gate electrodes. Gate spacers are formed on both sidewalls of the gate electrodes. A second concentration greater than the first concentration of the first impurity is ion implanted below the exposed surface of the semiconductor substrate using the gate electrodes and gate spacers as a mask to thereby form second source/drain regions having a lightly doped drain (LDD) structure Additional embodiments of the present invention provide a transistor for a semiconductor device having a gate electrode on a semiconductor substrate and source and drain regions in the semiconductor substrate adjacent opposite sides of the gate electrode. An anti-punchthrough region is provided in the semiconductor substrate that is below the gate electrode and spaced apart from the source and drain regions and the gate electrode. The anti-punchthrough region has a higher concentration of impurities at a center portion of the anti-punchthrough region than at edge portions of the anti-punchthrough region.

In particular embodiments of the present invention, the anti-punch through region comprises a first region of impurities in the semiconductor substrate and a second region of impurities in the semiconductor substrate. The first region and the second region overlap beneath a center portion of the gate electrode so as to provide the region of higher concentration impurities.

In additional embodiments of the present invention, the gate electrode comprises a plurality of spaced apart gate electrodes on the semiconductor substrate the source and drain regions comprise a plurality of source and drain regions between the plurality of gate electrodes and the anti-punchthrough region comprises a plurality of anti-punch through regions beneath respective ones of the gate electrodes.

In yet other embodiments of the present invention, the source and drain regions are first source and drain regions and the transistor further includes a sidewall spacer on sidewalls of the gate electrode. Second source and drain regions are provided adjacent the sidewall spacer and have a higher impurity concentration than the first source and drain regions so as to provide a lightly doped drain (LDD) structure.

BRIEF DESCRIPTION OF THE DRAWINGS

FIGS. 6A to 6I are cross-sectional views illustrating methods of forming capacitors including the transistors shown in FIG. 5E, according to embodiments of the present invention.

DESCRIPTION OF THE PREFERRED EMBODIMENTS

Figure 1:
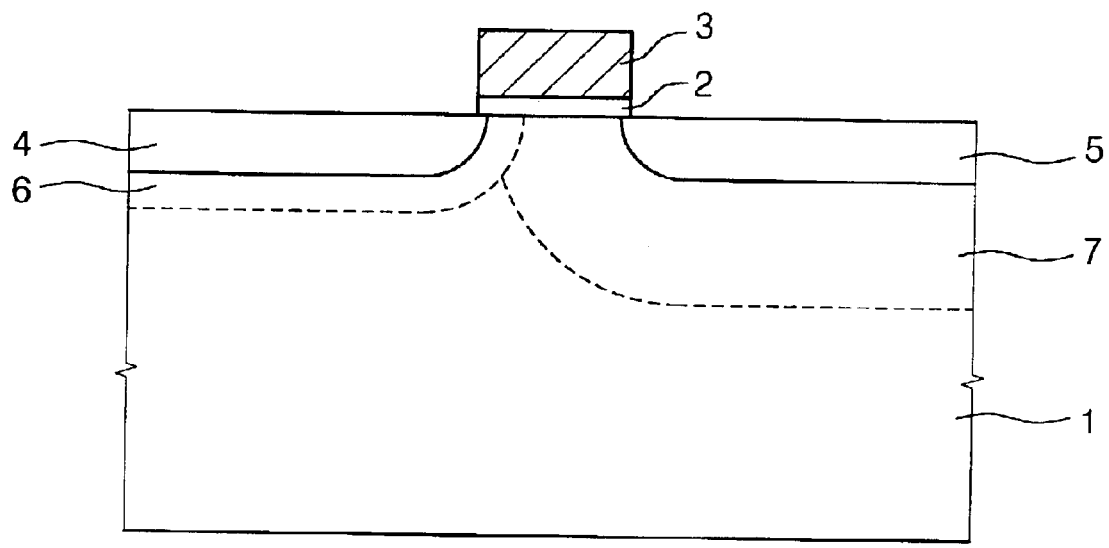
FIG. 1 is a cross-sectional view of a conventional MOS transistor.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. It also will be understood that when a layer or region is referred to as being "on" another layer or region, it can be directly on the other layer or region or intervening layers or regions may be present. In contrast, when a layer or region is referred to as being "directly on" another layer or region, there are no intervening layers or regions present.

In the drawings, the thickness of layers and regions are exaggerated for clarity. Furthermore, relative terms, such as "beneath", "upper", "top" or "bottom" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as "below" other elements in reference to the original figure would then be oriented "above" the other elements. The exemplary term "below", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Figure 2A:
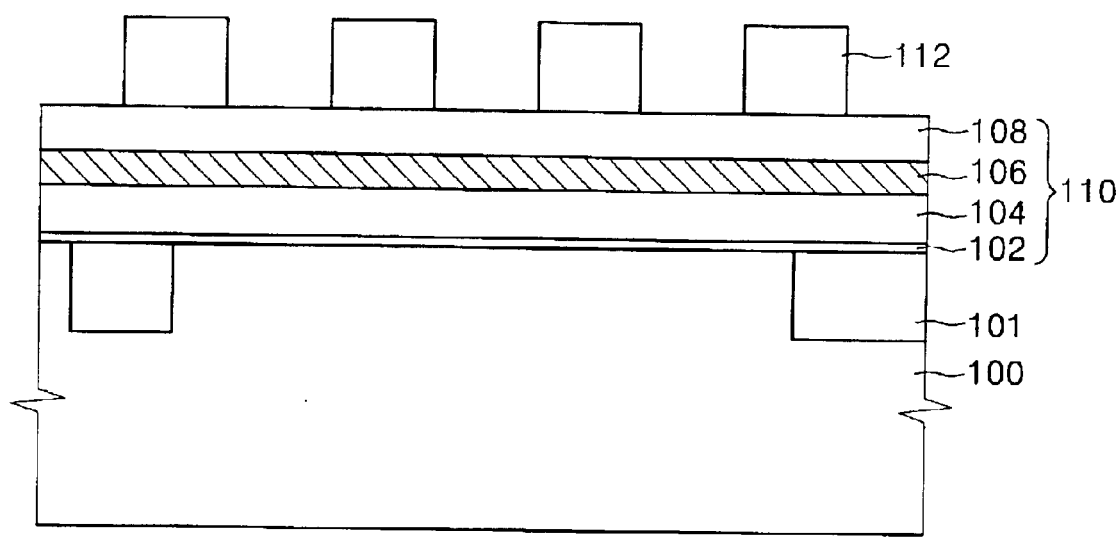
FIGS. 2A to 2D are cross-sectional views illustrating methods of forming transistors of a semiconductor device according to embodiments of the present invention.

FIGS. 2A to 2D are cross-sectional views illustrating a method of forming transistors of a semiconductor device in accordance with embodiments of the present invention. Referring to FIG. 2A, field oxide layers 101 are formed on a semiconductor substrate 100, such as a silicon substrate, through an isolation process, such as an isolation process for isolating memory cells from each other, thereby dividing the substrate 100 into active regions and field regions. In certain embodiments of the present invention, a shallow trench isolation (STI) process is utilized as the isolation process. Alternatively, a local oxidation of silicon (LOCOS) process or an improved LOCOS process may be used. Other processes may also be used.

Silicon oxide or silicon oxynitride is grown on the semiconductor substrate 100 to form a gate oxide layer 102 of cell transistors. A polysilicon layer 104 is deposited on the gate oxide layer 102, for example, by a low chemical vapor deposition (LCPVD) method. The polysilicon layer 104 is doped to a high concentration, for example, by POCl3 diffusion, ion implantation and/or in-situ doping.

A metal silicide layer 106 is formed on the polysilicon layer 104 and a silicon nitride layer 108 is formed on the metal silicide layer 106. The metal silicide layer 106 may be a tungsten silicide film, a titanium silicide film, and/or a cobalt suicide film, etc. Optionally, an anti-reflective layer may be formed on the silicon nitride layer 108, for example, by a CVD method. The anti-reflective layer may improve the formation of photoresist patterns by preventing light from being reflected from the underlying layer in a subsequent photolithography process.

Through a spin coating, a photoresist is coated on the silicon nitride layer 108 to form a photoresist layer (not shown). The photoresist layer is exposed and developed using a photomask, thereby forming photoresist patterns 112 for defining the layout a gate electrode.

Figure 2B:
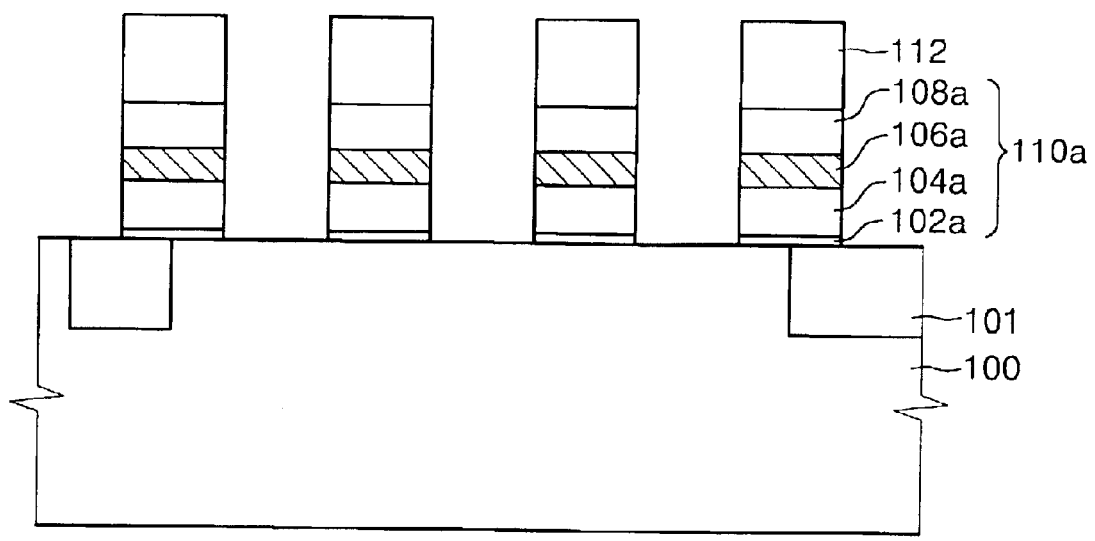

Referring to FIG. 2B, the resultant structure 110 is patterned using the photoresist patterns 112 as an etching mask, thereby forming a plurality of gate electrodes 110a that may, for example, serve as wordlines of memory cells on a cell area of the semiconductor substrate 100. Each of the gate electrodes 110a may include a gate oxide layer pattern 102a, a polysilicon layer pattern 104a, a metal suicide layer pattern 106a and a silicon nitride layer pattern 108a. The gate electrodes 110a may be formed at regular intervals between the field oxide layers 101, i.e., the isolation regions of the semiconductor substrate 100.

The photoresist patterns 112 remaining on the gate electrodes 110a may subsequently be removed, for example, by an etching process. Other conventional gate electrode fabrication processes may also be used.

Figure 2C:
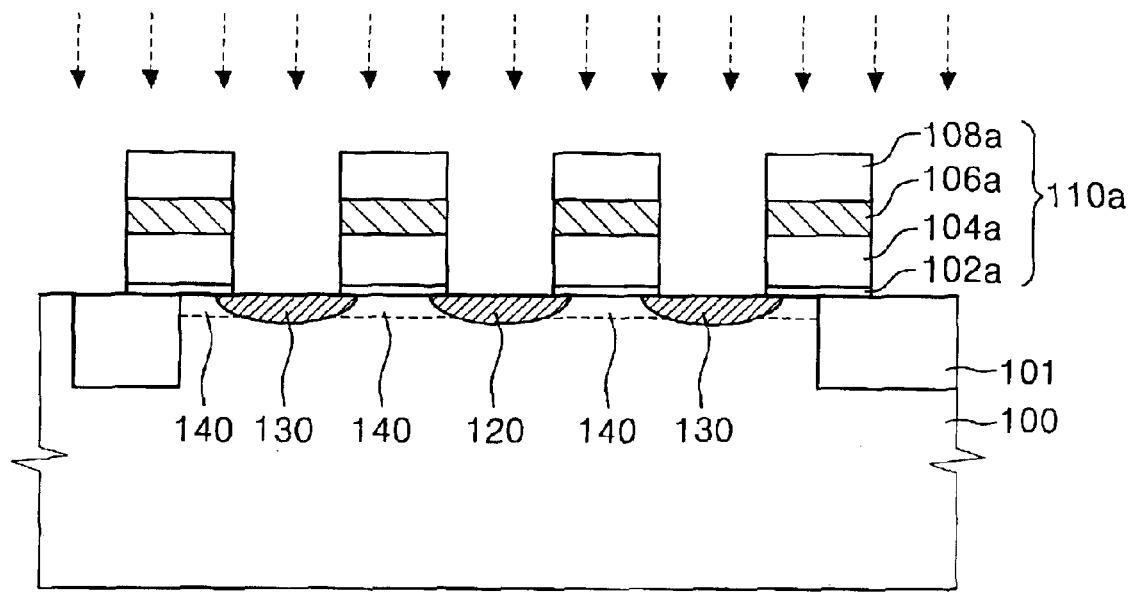

Referring to FIG. 2C, using the gate electrodes 110a formed on the semiconductor substrate 100 as an ion implantation mask, a first impurity is implanted below the exposed surface of the semiconductor substrate 100 where no gate electrode 110a is formed, thereby forming first impurity regions, i.e., first source/drain regions 120 and 130.

Figure 2D:
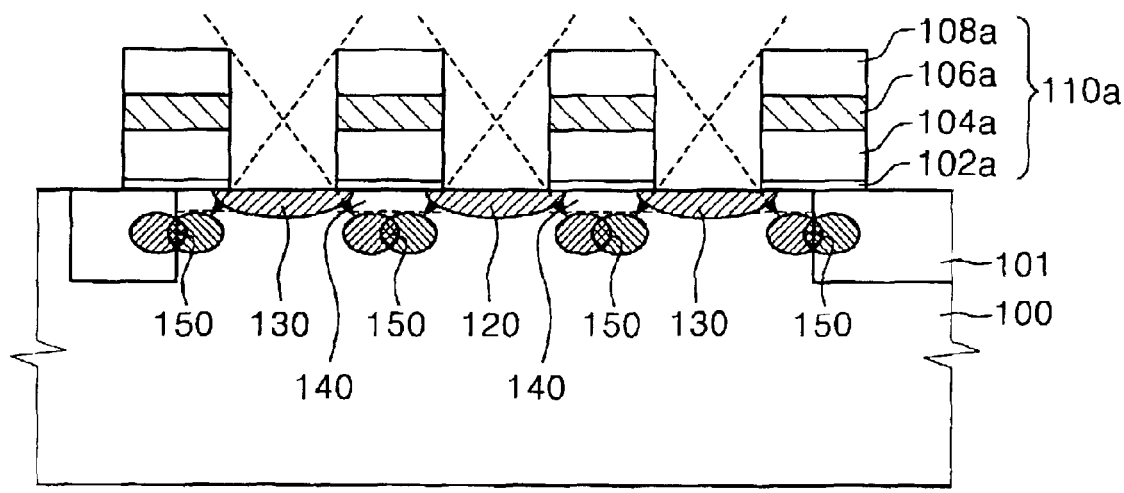

Referring to FIG. 2D, using the gate electrodes 110a as an ion implantation mask, a second impurity is ion implanted in both directions (two opposite symmetrical directions centering the gate electrodes 110a) at predetermined tilt angles, thereby locally forming anti-punchthrough regions 150 below the each of channel regions 140 existing under the gate electrodes 110a. In some embodiments, the anti-punchthrough regions 150 are separated (spaced apart) from the source/drain regions 120 and 130.

For an NMOS transistor, the first impurity for forming the source/drain regions 120 and 130 may be an N-type impurity of Group V elements such as phosphorous (P), arsenic (As) and antimony (An), and the second impurity for forming the anti-punchthrough regions 150 may be a P-type impurity of Group III elements such as boron (B), gallium (Ga) and indium (In). For a PMOS transistor, the first impurity for forming the source/drain regions 120 and 130 may be a P-type impurity of Group III element such as boron (B), gallium (Ga) and indium (In), and the second impurity for forming the anti-punchthrough regions 150 may be an N-type impurity of Group V element such as phosphorous (P), arsenic (As) and antimony (An).

In order to locally form the anti-punchthrough regions 150 below the channel region 140 existing under the gate electrode 110a by using the gate electrodes 110a as an ion implantation mask, process conditions such as a height (h) of the gate electrode 110a, a space (p) between the gate electrodes 110a, an ion implanting angle (θ) of the second impurity, an impurity dose ($cm^2$), etc may be controlled. For example, the gate electrode 110a may have a height (h) capable of locally forming the anti-punchthrough region 150 below the center of the channel region 140 by implanting the second impurity in the substrate surface exposed by the gate electrodes 110a, such that the anti-punchthrough region 150 is separated from the source/drain regions 120 and 130.

If the height (h) of the gate electrode 110a is too high, the second impurity implanted at a predetermined tilt angle is blocked by the gate electrode 110a, so that no anti-punchthrough region 150 is formed. Even though the anti-punchthrough region 150 is formed in this case, the anti-punchthrough regions may be created adjacent to the source/drain regions 120 and 130, thereby generating leakage current. Alternately, the anti-punchthrough region 150 may be formed at a position lower than those of the source/drain regions 120 and 130, so that the enlargement of depletion layer cannot be effectively prevented. Accordingly, as the lower the height (h) of the gate electrode 110a, the more easily the anti-punchthrough region 150 may be formed below the channel region 140 while being separated (or spaced apart) from the source/drain regions 120 and 130.

Furthermore, if the space (p) between the gate electrodes 110a is reduced, the implantation angle (θ) of the second impurity becomes almost 90° so that the anti-punchthrough regions 150 are formed adjacent to the source/drain regions 120 and 130, which, as discussed above may lead to the generation of leakage current, or the regions 150 are formed under the source/drain regions 120 and 130 and may not effectively prevent the enlargement of the depletion layer. Accordingly, the wider the space (p) between the gate electrodes 110a, the easier it may be to form the anti-punchthrough region 150 below the channel region 140.

Based on the height (h) of the gate electrode 110a and the space (p) between the gate electrodes 110a, the implantation angle (θ) of the second impurity is tilted to a predetermined angle with respect to the sides of the gate electrodes 110a such that the second impurity of high concentration is implanted in both directions (two opposite directions) toward the semiconductor substrate where no gate electrode 110a is formed.

In certain embodiments of the present invention, when the height (h) of the gate electrode 110a and the space (p) between the gate electrodes 110a are in the ratio of 2:1, the second impurity is ion implanted at a tilt angle of about 13° to about 18° from an angle perpendicular to the substrate, thereby forming the anti-punchthrough regions 150 below each of the channel regions 140 while being separated from the source/drain regions 120 and 130.

In some embodiments, the second impurity is implanted so as to provide two overlapping regions such that the difference in impurity concentration is large between the anti-punchthrough region 150 locally formed below the center of the channel region 140 and the source/drain regions 120 and 130 in which the first impurity is implanted. Thus, the impurity concentration where the two regions overlap, for example, a center portion of the anti-punchthrough region 150, may be greater than the impurity concentration in non-overlapping portions of the two regions, for example, an edge portion of the anti-punchthrough region 150.

The anti-punchthrough region 150 formed as described above can reduce the widening of the depletion layer in the channel region 140, thereby possibly improving or even optimizing a threshold voltage. Further, since the anti-punchthrough region 150 is formed to be separated from the source/drain regions 120 and 130, the junction leakage current can be decreased which may improve the refresh characteristic of the semiconductor device.

Figure 3:
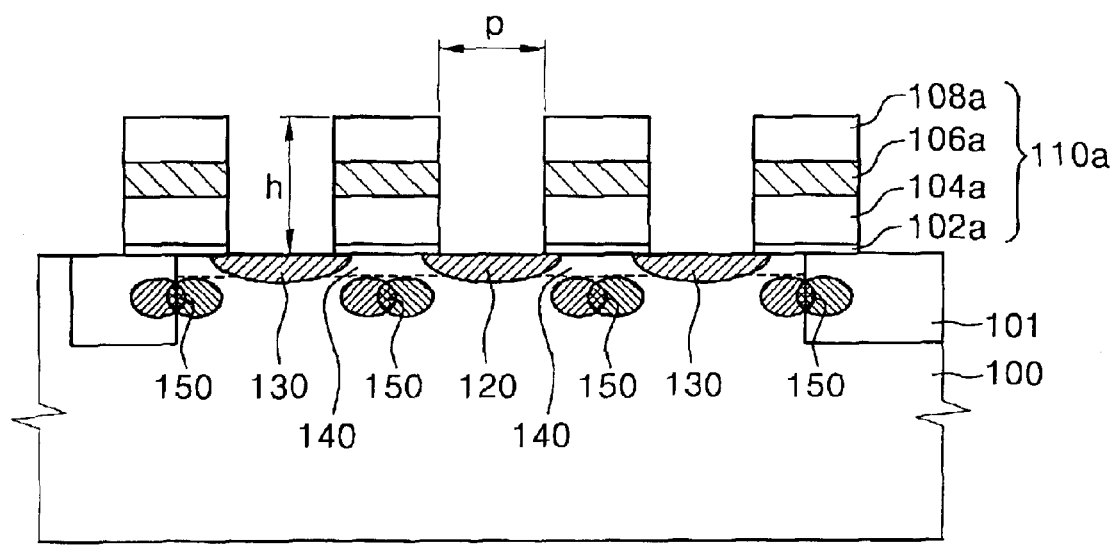
FIG. 3 is a cross-sectional view showing NMOS transistors of a semiconductor device formed according to embodiments of the present invention.

FIG. 3 is a cross-sectional view showing NMOS transistors of a semiconductor device formed according to embodiments of the present invention. Referring to FIG. 3, gate electrodes 110a are formed at regular intervals between the field oxide layers 101, that are isolation regions of a semiconductor substrate 100. Each of the gate electrodes 110a includes a gate oxide layer pattern 102a having a thickness of about 50 Å, a polysilicon layer pattern 104a having a thickness of about 1000 Å, a tungsten suicide layer pattern 106a having a thickness of about 500 Å and a silicon nitride layer pattern 108a having a thickness of about 500 Å. A height (h) of the gate electrode 100a is about 2000 Å and a pitch of the gate electrode 100a is about 1000 Å. The space (p) between the gate electrodes 110a is about 1000 Å.

Source and drain regions 120 and 130 doped with N-type impurity are formed by ion implanting a first impurity, e.g., phosphorous (P), below the exposed surface of the semiconductor substrate 100 where no gate electrode 110a is formed utilizing the gate electrodes 100a as an ion implantation mask.

Each of second impurity regions, i.e., anti-punchthrough regions 150 is locally formed below the channel region 140, and in some embodiments the center of the channel region 140, existing under each of the gate electrode 110a and is separated from the source/drain regions 120 and 130. In some embodiments, a second impurity, e.g., boron (B), is ion implanted in regions of the semiconductor substrate 100 without a gate electrode in both directions at tilt angles of about ±16° from an angle perpendicular to the semiconductor substrate 100, thereby forming the anti-punchthrough regions 150. The second impurity may be implanted so as to provide two overlapping regions such that the difference in impurity concentration may be large between the anti-punchthrough region 150 formed below the center of the channel region 140 and the source/drain regions 120 and 130 in which the first impurity is implanted.

In the present example, in order to form the anti-punchthrough regions 150, an ion implantation energy of about 45 keV and a dose of about $1.5 \times 10^{13}$ cm$^{-2}$ may be used. The ion implantation energy may be maintained substantially constant such that the ions do not penetrate the gate electrode and the ion concentration may be maximized below the center of the channel region. The dose may also be constantly maintained so as to improve and/or obtain an optimum threshold voltage.

Figure 4A:
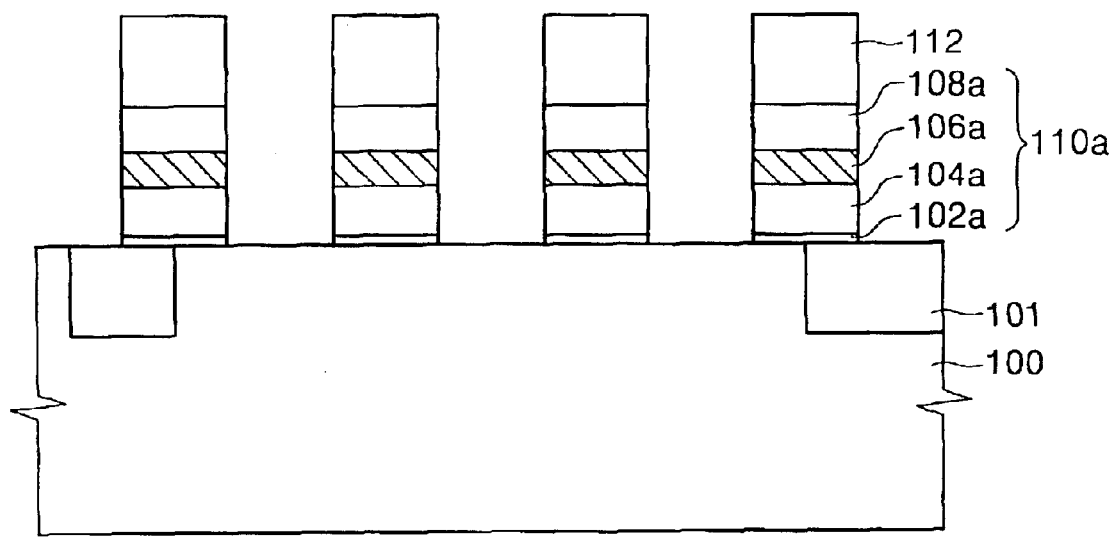
FIGS. 4A to 4C are cross-sectional views illustrating methods of forming NMOS transistors of a semiconductor device according to embodiments of the present invention.
Figure 4B:
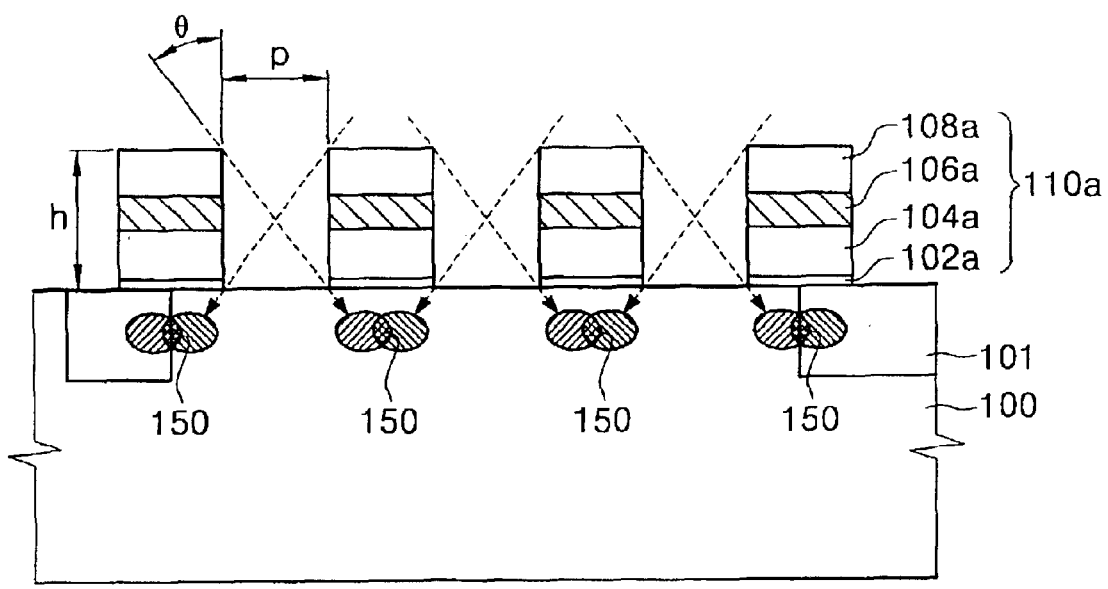
Figure 4C:
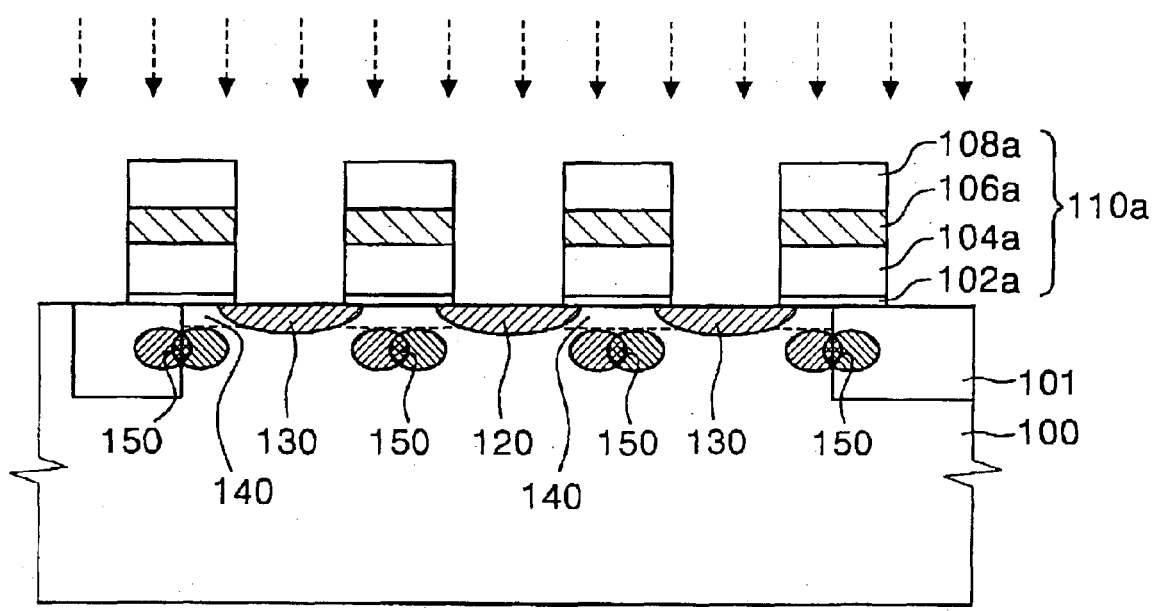

FIGS. 4A to 4C are cross-sectional views illustrating a method of forming NMOS transistors of a semiconductor device in accordance with further embodiments of the present invention. Referring to FIG. 4A, a gate oxide layer having a thickness of about 50 Å, a polysilicon layer having a thickness of about 1000 Å, a tungsten silicide layer having a thickness of about 500 Å and a silicon nitride layer having a thickness of about 500 Å are successively stacked on a semiconductor substrate 100 on which field oxide layers are formed as isolation regions. The resultant structure is patterned using a photomask to thereby form gate electrodes 110a, each of the gate electrodes 110a including a gate oxide layer pattern 102a, a polysilicon layer pattern 104a, a tungsten suicide layer pattern 106a and a silicon nitride layer pattern 108a.

A height (h) of the gate electrode 110a is about 2000 Å and a length of the top of the gate electrode 110a is about 1000 Å. When the gate electrodes 110a are formed between the field oxide layers 101, the space (p) between the gate electrodes 110a is about 1000 Å. Other gate electrode fabrication processes may also be used.

Referring to FIG. 4B, using the gate electrodes 110a as an ion implantation mask, a first impurity, e.g., boron (B), is ion implanted on either side of each of the gate electrodes 110a in two opposite directions at tilt angles of about ±16° from an angle perpendicular to the semiconductor substrate 100, thereby forming anti-punchthrough regions 150. The anti-punchthrough regions 150 are locally formed below the center of each of the gate electrodes 110a so as to be separated from subsequently formed source/drain regions. With ion implantation in both directions, the anti-punchthrough regions 150 overlapped under each of the gate electrodes 110a to reduce and/or prevent punchthrough. Process conditions of forming the anti-punchthrough regions 150 may be the same as described above.

Referring to FIG. 4C, using the gate electrodes 110a as an ion implantation mask, a second impurity, e.g., phosphorous (P), is ion implanted below the substrate surface exposed by the gate electrodes 110a to thereby form source/drain regions 120 and 130.

Figure 5A:
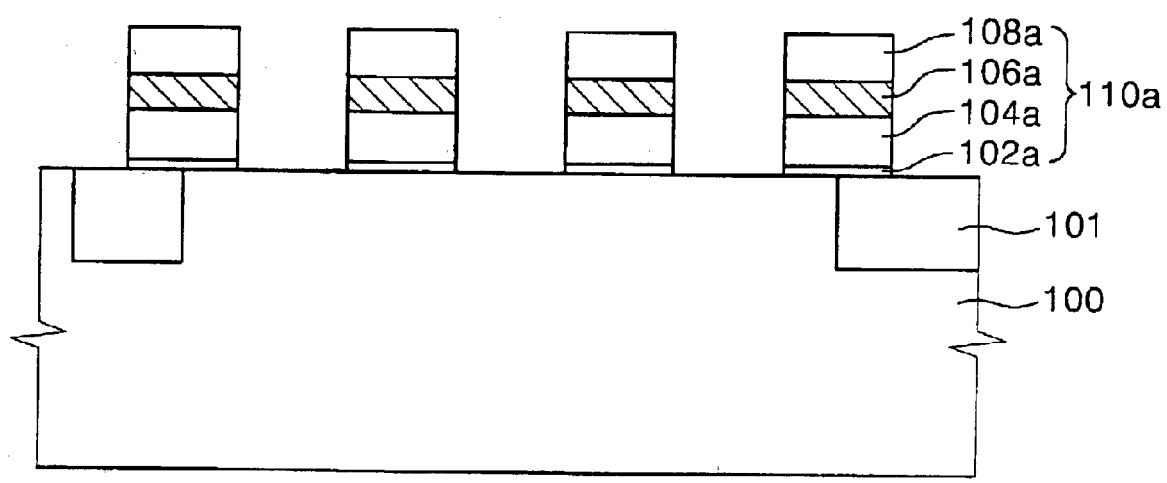
FIGS. 5A to 5E are cross-sectional views illustrating methods of forming NMOS transistors of a semiconductor device according to embodiments of the present invention.

FIGS. 5A to 5E are cross-sectional views illustrating methods of forming NMOS transistors of a semiconductor device in accordance with embodiments of the present invention. Referring to FIG. 5A, a gate oxide layer having a thickness of about 50 Å, a polysilicon layer having a thickness of about 1000 Å, a tungsten silicide layer having a thickness of about 500 Å and a silicon nitride layer having a thickness of about 500 Å are successively stacked on a semiconductor substrate 100 on which field oxide layers are formed as isolation regions. The resultant structure is patterned using a photomask to thereby form gate electrodes 110a, each of the gate electrodes 110a including a gate oxide layer pattern 102a, a polysilicon layer pattern 104a, a tungsten silicide layer pattern 106a and a silicon nitride layer pattern 108a. Other conventional gate electrodes may be formed.

The height (h) of the gate electrode 110a is about 2000 Å and a length of the top of the gate electrode 110a is about 1000 Å. When the gate electrodes 110a are formed between the field oxide layers 101, a space (p) between the gate electrodes 110a is about 1000 Å.

Figure 5B:
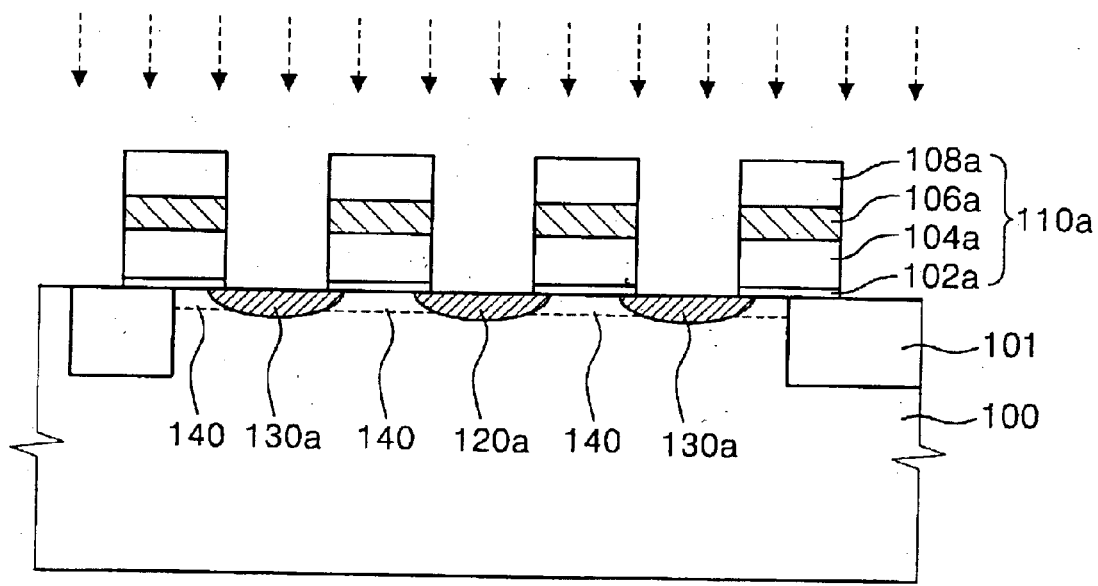

Referring to FIG. 5B, using the gate electrodes 110a as an ion implantation mask, an N-type first impurity of a relatively low concentration, e.g., phosphorous (P), is ion implanted below the surface of the semiconductor substrate 100, thereby forming first source/drain regions 120a and 130a.

Figure 5C:
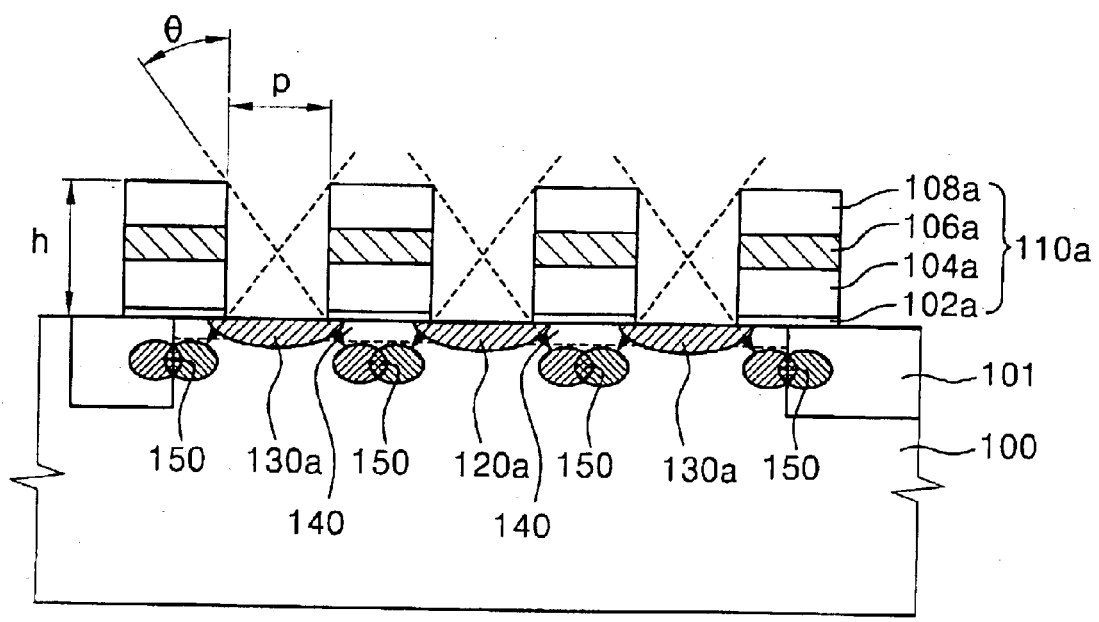

Referring to FIG. 5C, using the gate electrodes 110a as an ion implantation mask, a second impurity, e.g., boron (B), is ion implanted on either side of each of the gate electrodes 110a in both directions (two opposite directions) at tilt angles of about ±16° from an angle perpendicular to the semiconductor substrate 100, thereby forming anti-punchthrough regions 150. The anti-punchthrough regions 150 are formed below each of the gate electrodes 110a so as to be separated from first source/drain regions 120a and 130a. With the ion implantation executed in both directions, the anti-punchthrough regions 150 overlap with each other below each of the channel regions 140 to reduce and/or prevent punchthrough. Process conditions of forming the anti-punchthrough regions 150 may be the same as described above.

Figure 5D:
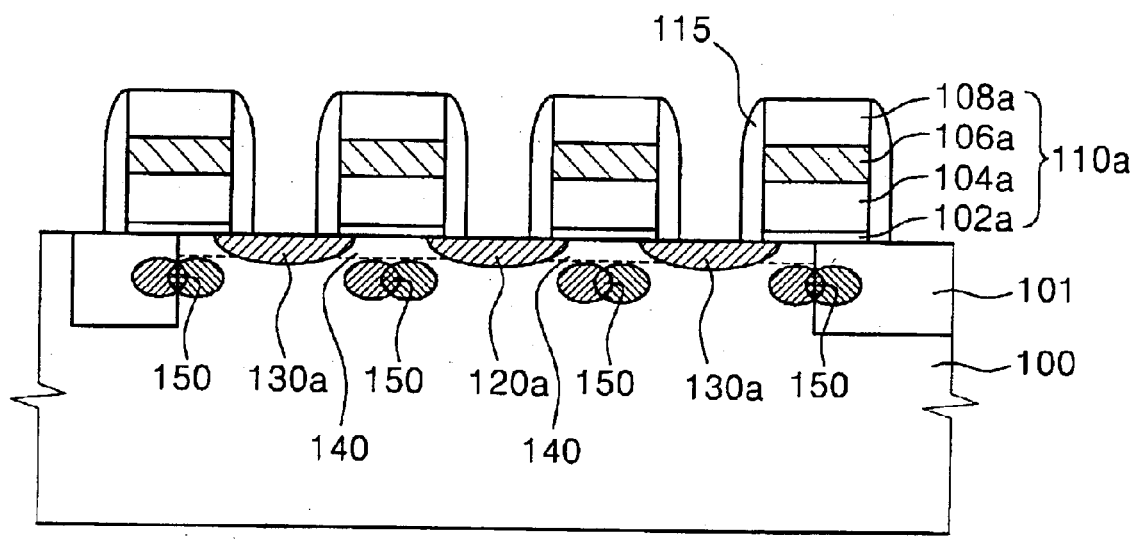

Referring to FIG. 5D, after forming the anti-punchthrough regions 150 as described above, a nitride layer is deposited to a thickness of about 100 Å on the gate electrodes 110a and the semiconductor substrate 100. The nitride layer is etched back until the top surfaces of the gate electrodes 110a and the substrate 100 are exposed, thereby forming gate spacers 115 on both sides of each of the gate electrodes 110a.

Figure 5E:
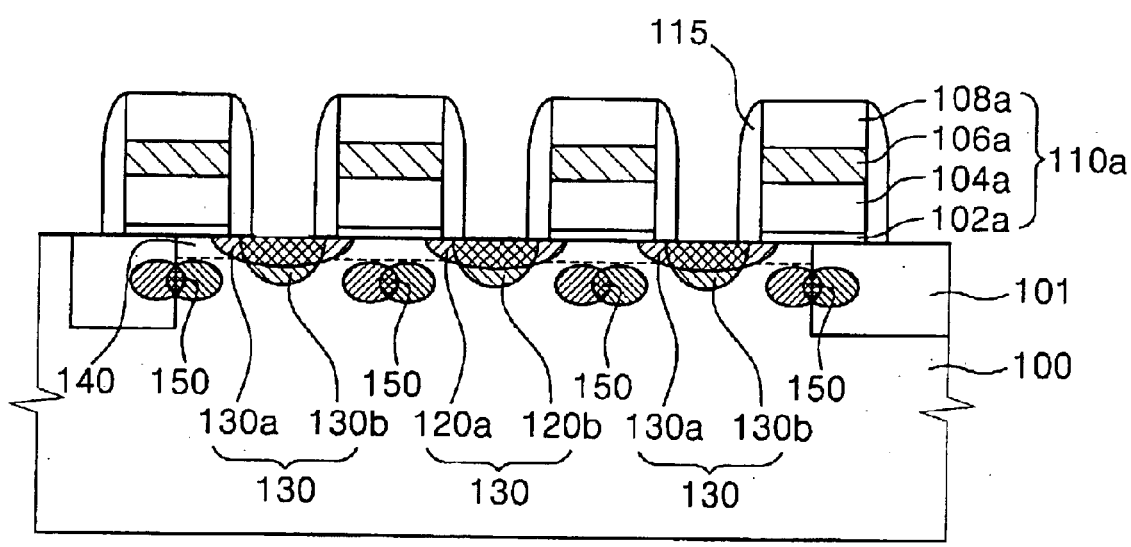

Referring to FIG. 5E, using the gate electrodes 110a as an ion implantation mask, an N-type impurity, e.g., phosphorous (P), is ion implanted below the surface of the semiconductor substrate 100 where the first source/drain regions 120a and 130a are formed, thereby forming second source/drain regions 120b and 130b. Thus, source/drain regions 120 and 130 may be formed having an LDD structure resulting from the overlap of the first and second source/drain regions.

Figure 6A:
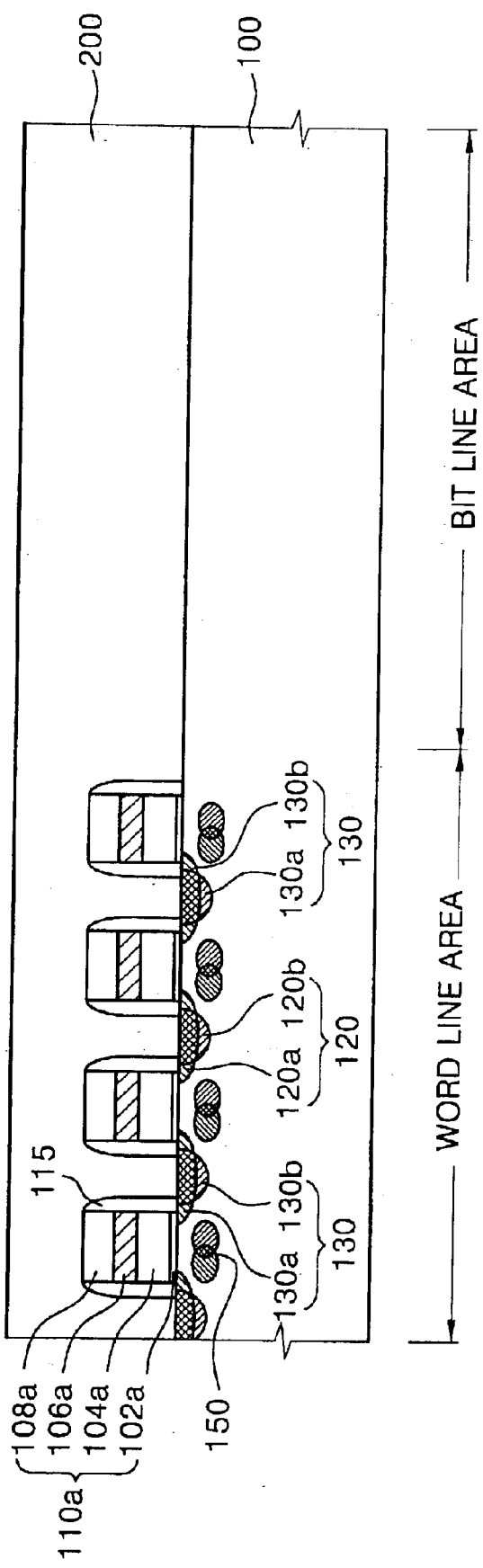

FIGS. 6A to 6I are cross-sectional views illustrating a method of forming capacitors including the transistors shown in FIG. 5E, according to further embodiments of the present invention. Referring to FIG. 6A, a first oxide layer is deposited on the transistors in which the anti-punchthrough regions 150 are formed. Then, through an etch-back process or a chemical mechanical polishing (CMP) process, the first oxide layer is removed until the top of the gate electrodes 110a are exposed, thereby forming a first insulating interlayer 200. The first oxide layer may be borophospho silicate glass (BPSG), undoped silicate glass (USG) and/or silicon oxide.

Figure 6B:
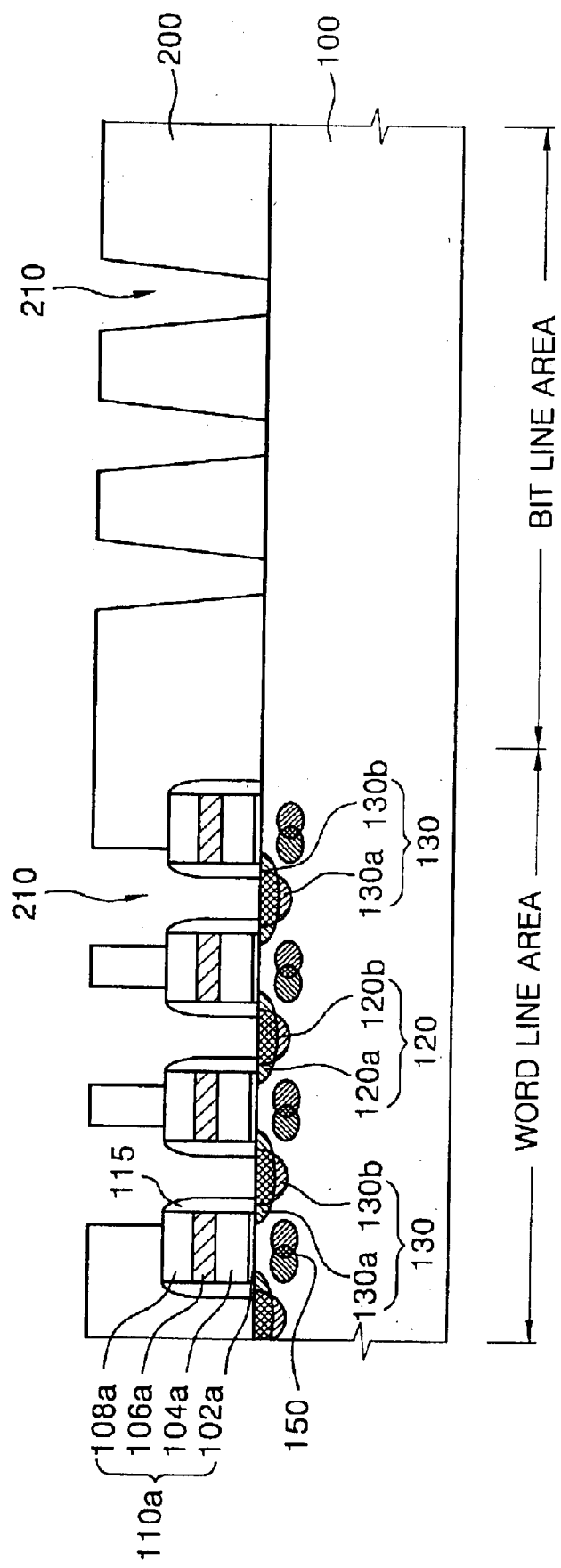

Referring to FIG. 6B, mask patterns (not shown) exposing portions of the first insulating interlayer 200 are formed on the planarized first insulating interlayer 200. Using the mask patterns as an etching mask, the portions of the first insulating interlayer 200 located between the gate spacers 115 are anisotropically etched away to form buried contact holes 210 exposing regions of the semiconductor substrate 100. The buried contact holes 210 may be formed by self-aligned contact technology capable of securing a process margin by the gate spacers 115.

Figure 6C:
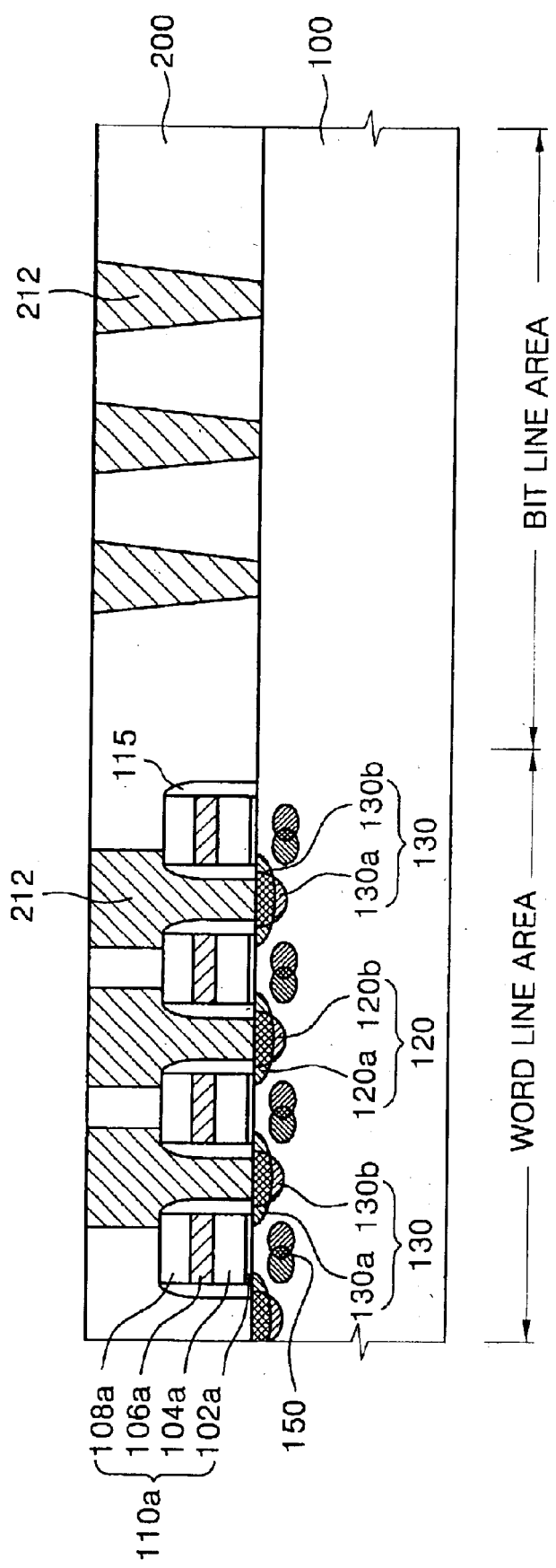

Referring to FIG. 6C, a conductive material to be electrically connected to the predetermined regions of the semiconductor substrate 100 is deposited so as to fill the buried contact holes 210 and etched back to remove the conductive material on the first insulating interlayer 200. The buried contact holes 210 are filled with the conductive material to form conductive plugs 212.

Figure 6D:
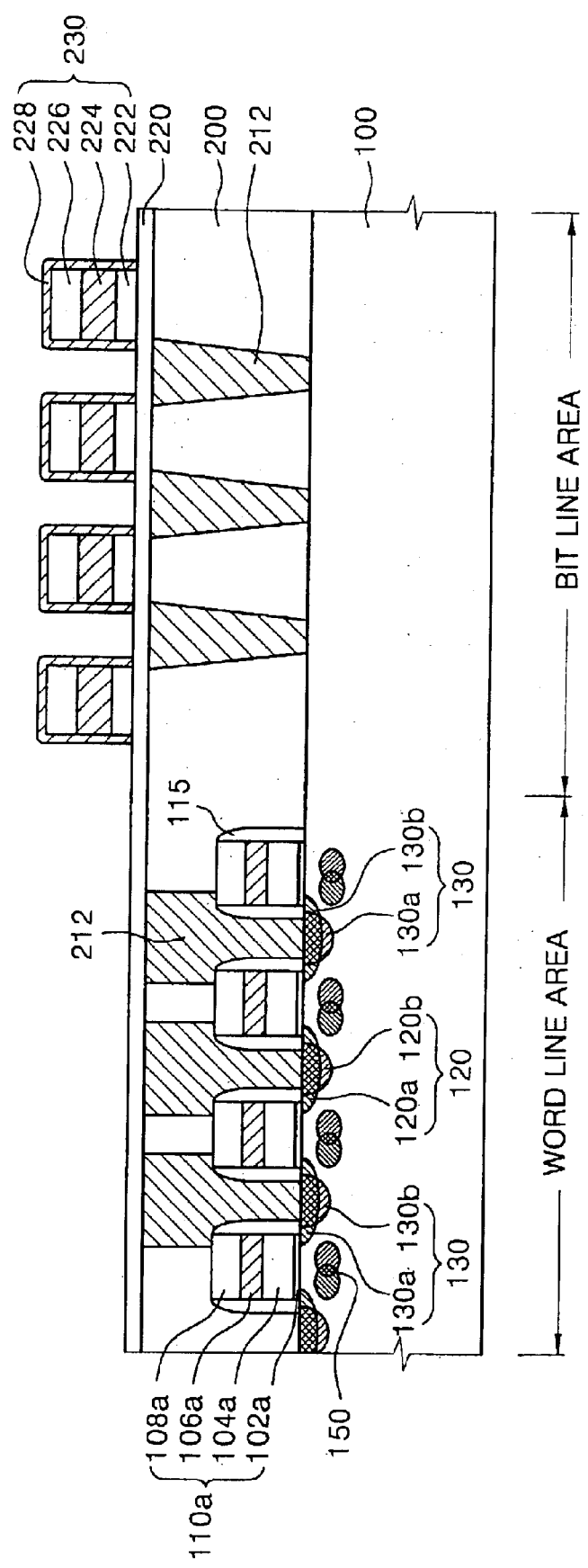

Referring to FIG. 6D, a second oxide layer is deposited on the first insulating interlayer 200 and the conductive plugs 212, thereby forming a second insulating interlayer 220. Bitline electrodes 230 having bitline spacers 228 are formed on the second insulating interlayer 220. In particular embodiments, a tungsten layer 222 for that may enhance the speed of the semiconductor device is deposited and a tungsten silicide layer 224 is formed on the tungsten film 222. A silicon nitride layer 226 is formed on the tungsten silicide layer 224 and the stacked structure including the silicon nitride layer 226, the tungsten silicide layer 224 and the tungsten layer 222 is patterned to form the bitline electrodes 230. A nitride layer having a uniform thickness is deposited on the second insulating interlayer 220 and the bitline electrodes 230 and etched back to form the bitline spacers 228.

Referring to FIG. 6E, a third oxide layer is deposited on the second insulating interlayer 220 and the bitline electrodes 230. The third oxide layer is planarized by a CMP process such that the top surfaces of the bitline electrodes 230 are not exposed, thereby forming a planarized third insulating interlayer 234.

Referring to FIG. 6F, portions of the third and second insulating interlayers 234 and 220 located between the bitline electrodes 230 are anisotropically etched away to form first contact holes 236 exposing the top surfaces of the conductive plugs 212. The first contact holes 236 are filled with a conductive material to form contact pads 238.

Figure 6G:
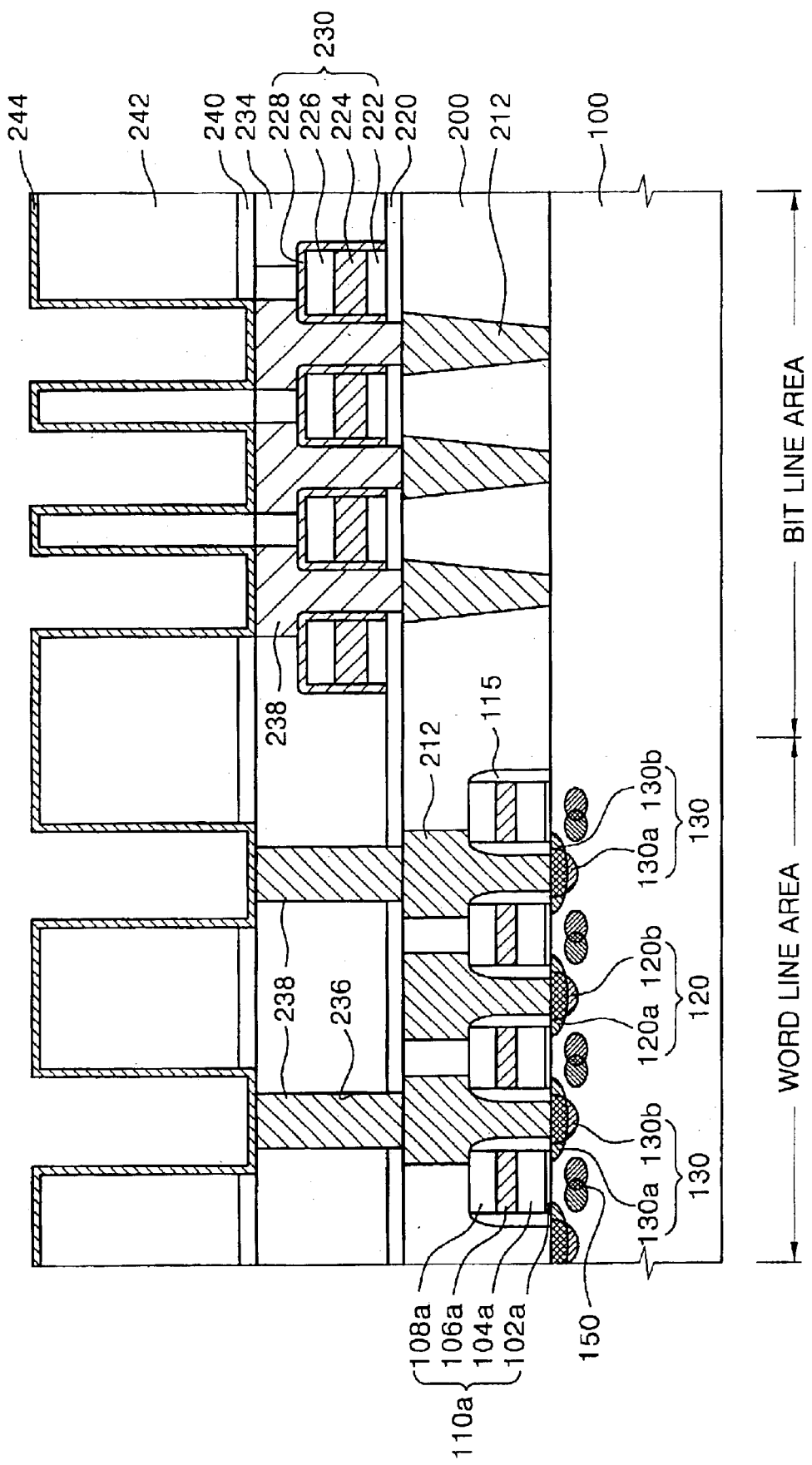

Referring to FIG. 6G, after successively depositing an etch stopping layer 240 and a fourth oxide layer on the resultant structure, an etching mask (not shown) is formed on the fourth oxide layer. Using the etching mask, the fourth oxide layer and the etch stopping layer 240 are anisotropically etched away to form a fourth insulating interlayer 242 having patterns exposing each of the contact pads 238. A polysilicon layer for a lower electrode having a uniform thickness is deposited on the top and the side of the fourth insulating interlayer 242, thereby forming storage electrodes 244.

Figure 6H:
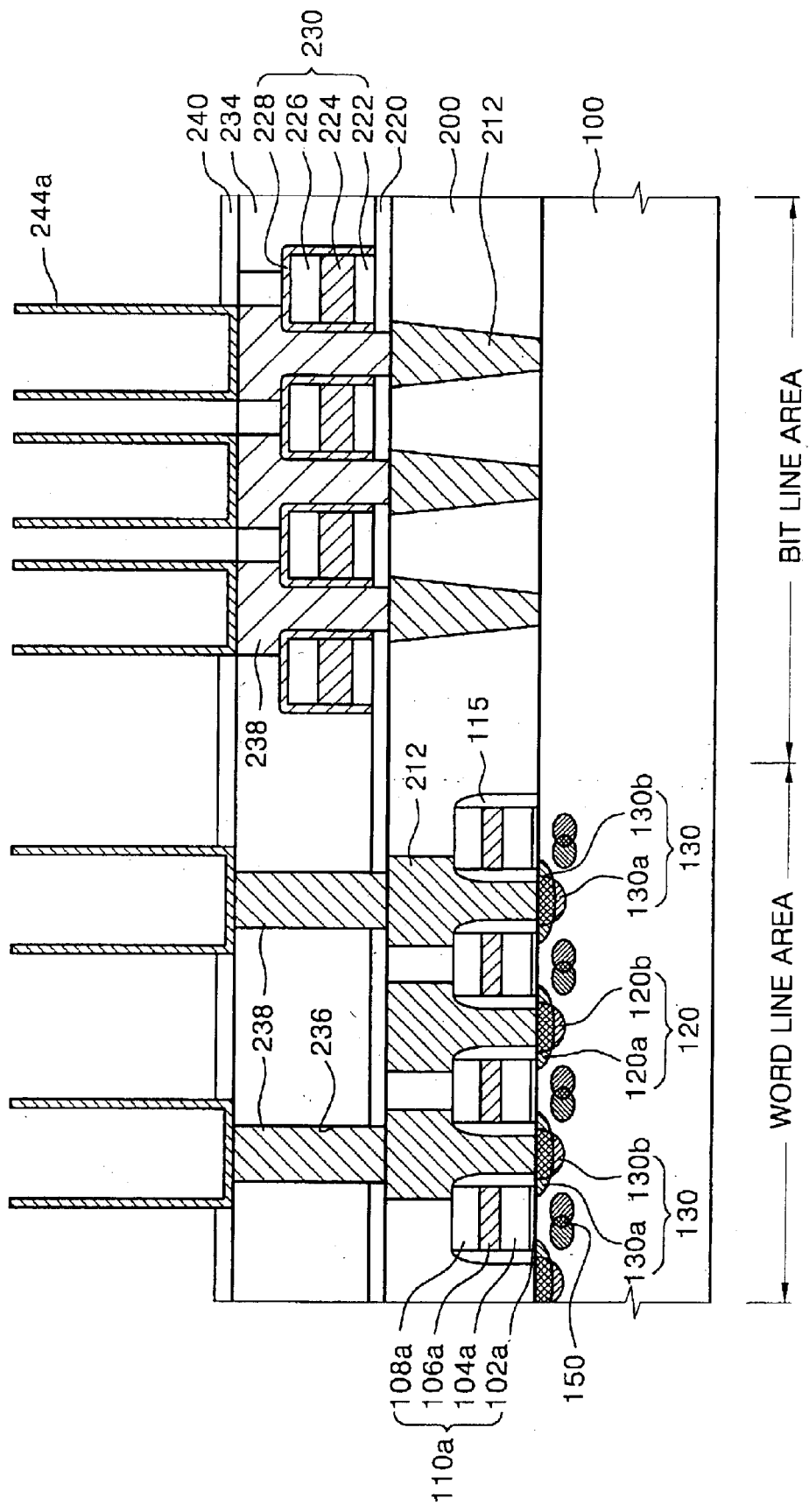

Referring to FIG. 6H, a CMP process is applied to the storage electrodes 244 on the top of the fourth insulating interlayer 242 so as to expose the top surface of the fourth insulating interlayer 242, thereby forming cylindrical storage electrodes 244a whose nodes are separated from each other. The fourth insulating interlayer 242 located on the etch stopping layer 240 is removed by etching.

Figure 6I:
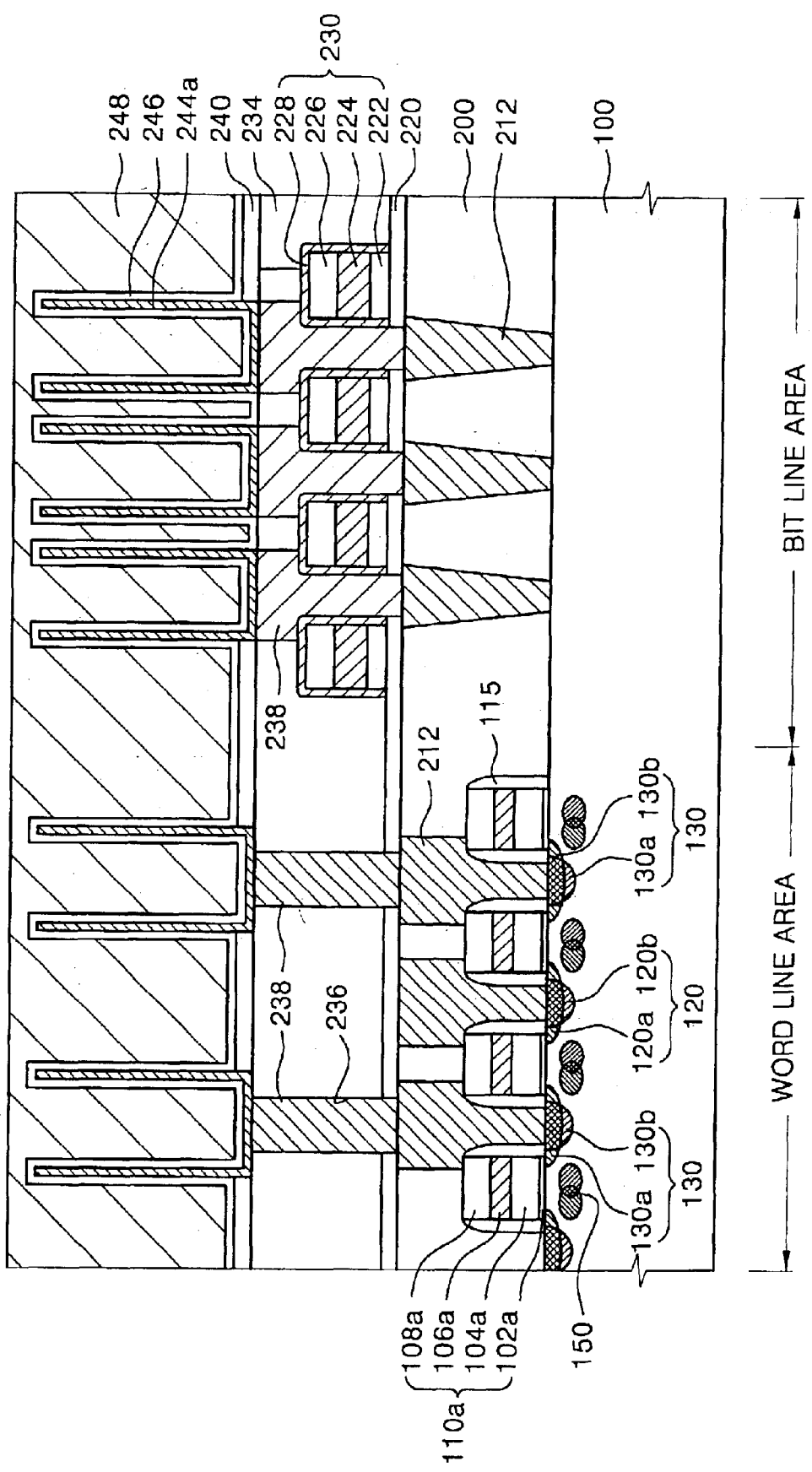

Referring to FIG. 6I, a dielectric layer 246 having a uniform thickness is formed on the node-separated storage electrodes 244a. The dielectric layer 246 may be a tantalum oxide layer ($Ta_2O_5$), an aluminum oxide layer ($Al_2O_3$) formed by atomic layer deposition (ALD), and/or a dual layer consisting of a nitride layer and an oxide layer. An upper electrode 248 is formed on the dielectric layer 246 to form capacitors of the semiconductor device.

According to the present invention, the anti-punchthrough region plays a role of optimizing the doping concentration of the channel region to adjust the threshold voltage, and also, of reducing the widening of the deletion layer in the channel region to increase the punchthrough voltage. Further, since the anti-punchthrough region is locally formed under the center of the gate electrode, the source/drain regions are completely separated from the anti-punchthrough region. Accordingly, the source/drain junction capacitance is reduced and the junction leakage current is prevented to thereby improve the refresh characteristic of a semiconductor device.

Although particular embodiments of the present invention have been described, it is understood that the present invention should not be limited to these embodiments but various changes and modifications can be made by one skilled in the art within the spirit and scope of the present invention as hereinafter claimed.

What is claimed is:

1. A method of forming transistors of a semiconductor device comprising:

forming a plurality of gate electrodes on a semiconductor substrate;

ion-implanting a first impurity below an exposed surface of the semiconductor substrate using the gate electrodes as an ion implantation mask, to thereby form first impurity regions; and ion-implanting a second impurity in two directions at predetermined tilt angles, using the gate electrodes as an ion implantation mask, to thereby form second impurity regions separated from the first impurity regions, each of the second impurity regions being formed under respective ones of the gate electrodes.

2. The method according to claim 1, wherein the gate electrodes are formed at equal intervals between isolation regions of the semiconductor substrate.

3. The method according to claim 1, wherein forming a plurality of gate electrodes comprises:

forming a gate oxide layer on the semiconductor substrate;

forming a polysilicon layer on the gate oxide layer;

forming a metal silicide layer on the polysilicon layer;

forming a silicon nitride layer on the metal silicide layer; and patterning the gate oxide layer, polysilicon layer, metal silicide layer and silicon nitride layer using an etching mask to provide the plurality of gate electrodes.

4. The method according to claim 1, wherein the first impurity regions are source/drain regions.

5. The method according to claim 1, wherein the first impurity is a Group V element and the second impurity is a Group III element.

6. The method according to claim 1, wherein the first impurity is a Group III element and the second impurity is a Group V element.

7. The method according to claim 1, wherein the second impurity regions are formed to overlap with each other below a center of the respective ones of the channel region.

8. The method according to claim 1, wherein the ion implantation angle is determined based on a height of the gate electrode and a space between the gate electrodes.

9. The method according to claim 1, wherein the step of ion-implanting a first impurity is followed by the step of ion implanting a second impurity.

10. The method according to claim 1, wherein the step of ion implanting a first impurity is preceded by the step of ion implanting a second impurity.

11. A method of forming transistors of a semiconductor device comprising:

forming a plurality of gate electrodes on a semiconductor substrate;

ion-implanting a first concentration of a first impurity below an exposed surface of the semiconductor substrate using the gate electrodes as an ion implantation mask, to thereby form first source/drain regions;

ion-implanting a second impurity in two directions at predetermined tilt angles, using the gate electrodes as an ion implantation mask, to thereby form second impurity regions separated from the first source/drain regions, a respective one of the second impurity regions being formed below a respective one of the gate electrodes;

forming gate spacers on both sidewalls of the gate electrodes; and ion-implanting at a second concentration greater than the first concentration, the first impurity below the exposed surface of the semiconductor substrate using the gate electrodes and gate spacers as a mask, to thereby form second source/drain regions having a lightly doped drain (LDD) structure.

12. The method according to claim 11, wherein the gate electrodes are formed at equal intervals between isolation regions of the semiconductor substrate.

13. The method according to claim 11, wherein the first impurity is a Group V element and the second impurity is a Group III element.

14. The method according to claim 11, wherein the first impurity is a Group III element and the second impurity is a Group V element.

15. The method according to claim 11, wherein the ion implantation angle is determined based on a height of the gate electrode and a space between the gate electrodes.

16. The method according to claim 11, wherein the second impurity regions are formed to overlap below a center of respective ones of the channel regions.

17. A transistor for a semiconductor device, comprising:

a gate electrode on a semiconductor substrate;

source and drain regions in the semiconductor substrate adjacent opposite sides of the gate electrode; and an anti-punchthrough region in the semiconductor substrate that is below the gate electrode and spaced apart from the source and drain regions and the gate electrode, the anti-punchthrough region having a higher concentration of impurities at a center portion of the anti-punchthrough region than at edge portions of the anti-punchthrough region.

18. The transistor of claim 17, wherein the anti-punch through region comprises a first region of impurities in the semiconductor substrate and a second region of impurities in the semiconductor substrate, the first region and the second region overlapping beneath a center portion of the gate electrode so as to provide the region of higher concentration impurities.

19. The transistor of claim 17, wherein the gate electrode comprises a plurality of spaced apart gate electrodes on the semiconductor substrate;

the source and drain regions comprise a plurality of source and drain regions between the plurality of gate electrodes; and the anti-punchthrough region comprises a plurality of anti-punch through regions beneath respective ones of the gate electrodes.

20. The transistor of claim 17, wherein the source and drain regions comprise first source and drain regions, the transistor further comprising:

a sidewall spacer on sidewalls of the gate electrode;

second source and drain regions adjacent the sidewall spacer and having a higher impurity concentration than the first source and drain regions so as to provide a lightly doped drain (LDD) structure.

* * * * *